United States Patent
Liu et al.

(10) Patent No.: US 11,917,773 B2
(45) Date of Patent: Feb. 27, 2024

(54) SYSTEMS AND METHODS FOR MAGNETIC BARRIER ASSEMBLY

(71) Applicant: Apple Inc., Cupertino, CA (US)

(72) Inventors: Saijin Liu, San Jose, CA (US); Tongbi T. Jiang, Santa Clara, CA (US)

(73) Assignee: Apple, Inc., Cupertino, CA (US)

( * ) Notice: Subject to any disclaimer, the term of this patent is extended or adjusted under 35 U.S.C. 154(b) by 70 days.

(21) Appl. No.: 17/539,745

(22) Filed: Dec. 1, 2021

(65) Prior Publication Data

US 2023/0090608 A1 Mar. 23, 2023

Related U.S. Application Data

(60) Provisional application No. 63/261,390, filed on Sep. 20, 2021.

(51) Int. Cl.
| | |
|---|---|
| *H05K 5/02* | (2006.01) |
| *H01F 7/02* | (2006.01) |
| *G01V 8/20* | (2006.01) |

(52) U.S. Cl.
CPC .............. *H05K 5/02* (2013.01); *G01V 8/20* (2013.01); *H01F 7/02* (2013.01)

(58) Field of Classification Search
CPC .............. H05K 5/02; G01V 8/20; H01F 7/02
See application file for complete search history.

(56) References Cited

U.S. PATENT DOCUMENTS

| | | | |
|---|---|---|---|
| 2016/0310027 A1* | 10/2016 | Han | .......... A61B 5/6898 |
| 2021/0093237 A1 | 4/2021 | Venugopal et al. | |
| 2021/0173424 A1 | 6/2021 | Robl et al. | |
| 2021/0278561 A1 | 9/2021 | Mehra et al. | |
| 2021/0290120 A1 | 9/2021 | Al-Ali et al. | |

FOREIGN PATENT DOCUMENTS

CN         105813804 A  *  7/2016  ............. G04G 17/02

* cited by examiner

*Primary Examiner* — Kevin K Pyo
(74) *Attorney, Agent, or Firm* — Fletcher Yoder, PC

(57) ABSTRACT

An embodiment of a barrier assembly includes a housing having an aperture and a magnet at least partially disposed within the housing. A first surface of the magnet is exposed. The barrier assembly also includes a light-emitting component disposed within the aperture. Another embodiment of a barrier assembly includes a housing having a plurality of apertures formed about a perimeter of the housing. The barrier assembly also includes a magnet at least partially embedded within the housing and the magnet includes an opening formed through a center of the magnet and a plurality of light-emitting components, each light-emitting component at least partially disposed within a corresponding aperture of the plurality of apertures.

20 Claims, 8 Drawing Sheets

SYSTEMS AND METHODS FOR MAGNETIC BARRIER ASSEMBLY

CROSS-REFERENCE TO RELATED APPLICATIONS

This application claims priority to U.S. Provisional Application No. 63/261,390, entitled "SYSTEMS AND METHODS FOR MAGNETIC BARRIER ASSEMBLY," filed Sep. 20, 2021, the disclosure of which is hereby incorporated by reference in its entirety for all purposes.

BACKGROUND

The present disclosure relates generally to light barrier assemblies, and more specifically to light barrier assemblies including magnets and methods of forming light barrier assemblies.

Electronic devices may utilize wireless charging stations to charge onboard batteries and corresponding magnets in the electronic device to hold the electronic device in place during a charging session. However, large magnets may consume valuable space, increase weight, and be expensive to utilize in wearable electronic devices.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a barrier assembly includes a housing having an aperture and a magnet at least partially disposed within the housing. A first surface of the magnet is exposed. The barrier assembly also includes a light-emitting component disposed within the aperture.

In another embodiment, a barrier assembly includes a housing having a plurality of apertures formed about a perimeter of the housing, a magnet at least partially embedded within the housing, the magnet having an opening formed through a center of the magnet, and a plurality of light-emitting components, each light-emitting component at least partially disposed within a corresponding aperture of the plurality of apertures.

In yet another embodiment, a method of forming a barrier assembly includes placing a plurality of magnets on a substrate and depositing a material onto the substrate. The deposited material may at least partially cover the plurality of magnets. The method may also include removing the plurality of magnets and the deposited material from the substrate, forming an aperture through the deposited material, and assembling a light-emitting component at least partially within the aperture.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the term "approximately," "near," "about", and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on).

The presently disclosed embodiments include a light barrier assembly for a wearable electronic device and methods of forming the same. Each barrier assembly may include a housing that reduces and/or prevents light and/or optical transmission between light-emitting components and light sensors disposed in apertures of the housing. A set of magnets may be embedded in the housing and may enable magnetically coupling the wearable electronic device to a charging station. In some embodiments, the housing may be formed over the magnets and the housing may be formed of an epoxy material.

Figure 1:
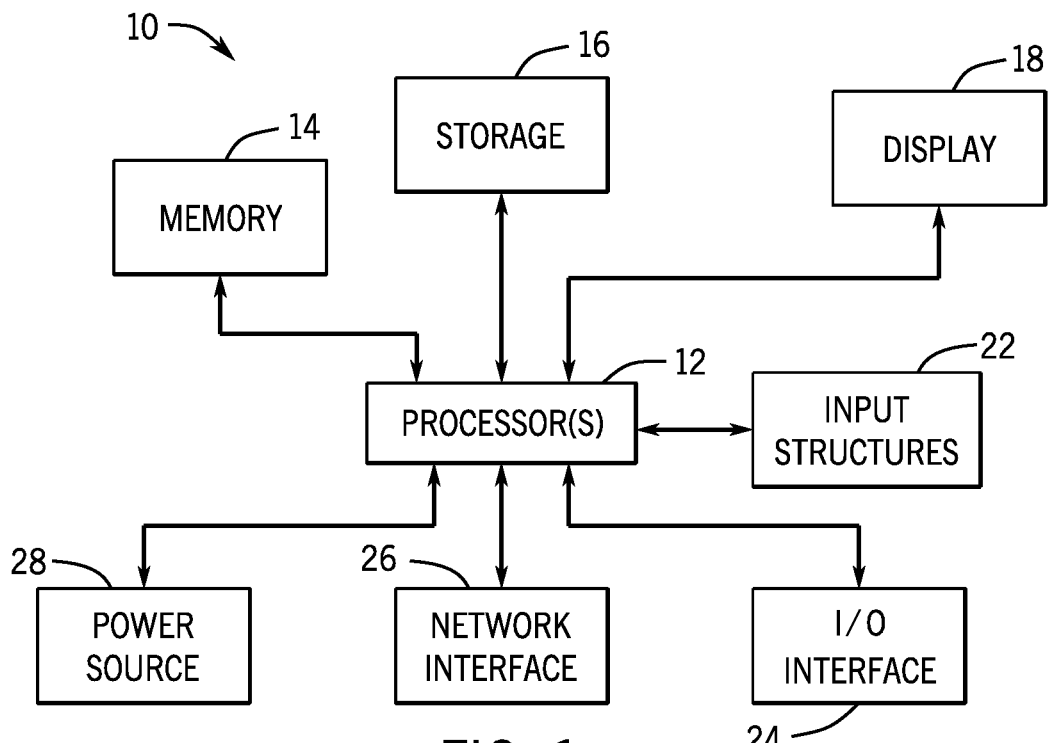
FIG. 1 is a block diagram of an electronic device, according to an embodiment of the present disclosure.

Turning first to FIG. 1, an electronic device 10 according to an embodiment of the present disclosure may include, among other things, one or more processors 12 (collectively referred to herein as the "processor 12"), memory 14, nonvolatile storage 16, a display 18, input structures 22, an input/output (I/O) interface 24, a network interface 26, and a power source 28. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
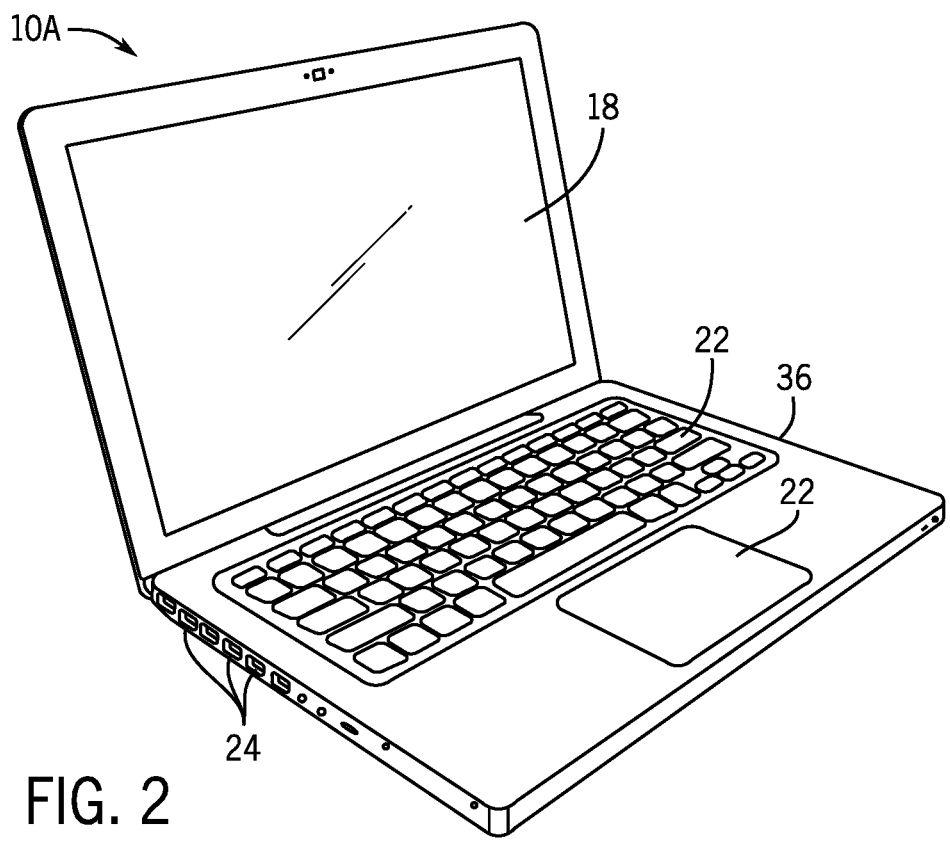
FIG. 2 is a perspective view of a notebook computer representing an embodiment of the electronic device of FIG. 1.
Figure 4:
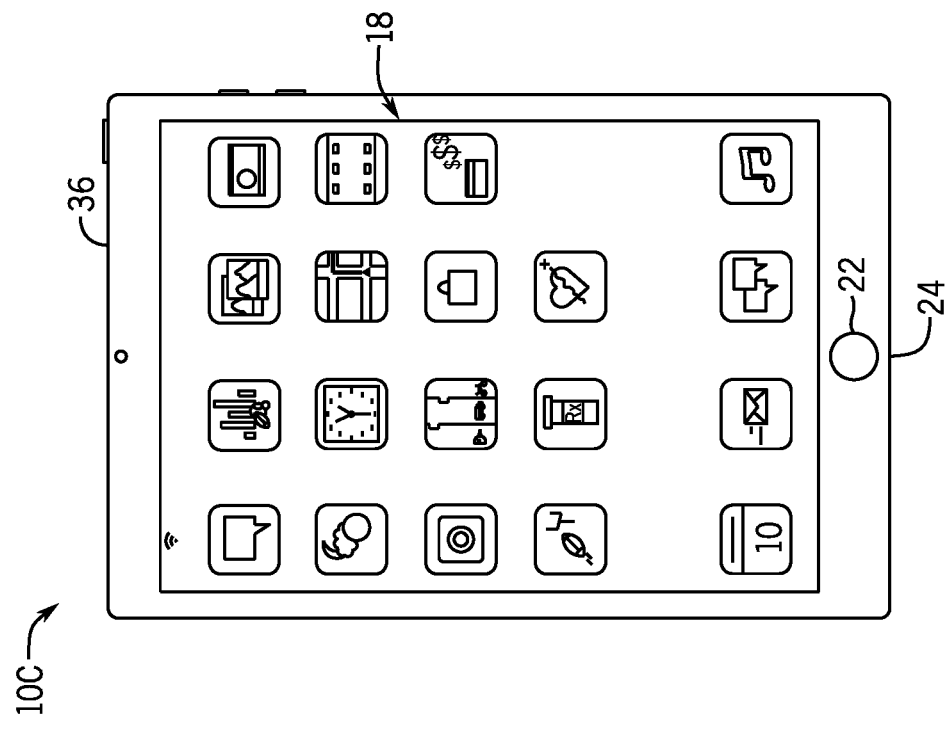
FIG. 4 is a front view of another handheld device representing another embodiment of the electronic device of FIG. 1.
Figure 3:
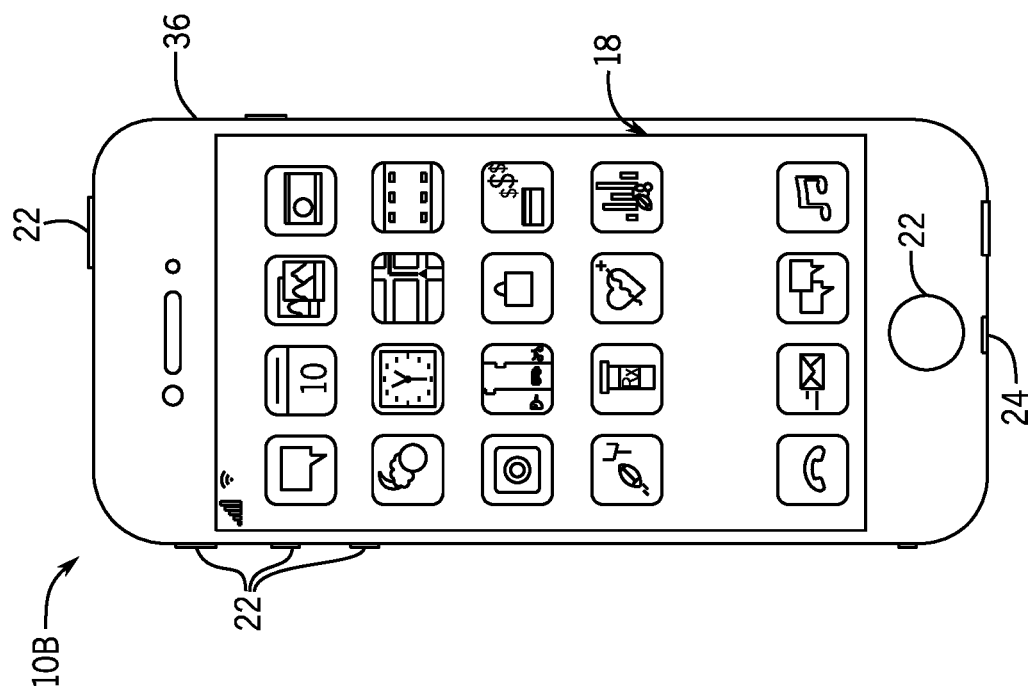
FIG. 3 is a front view of a handheld device representing another embodiment of the electronic device of FIG. 1.
Figure 5:
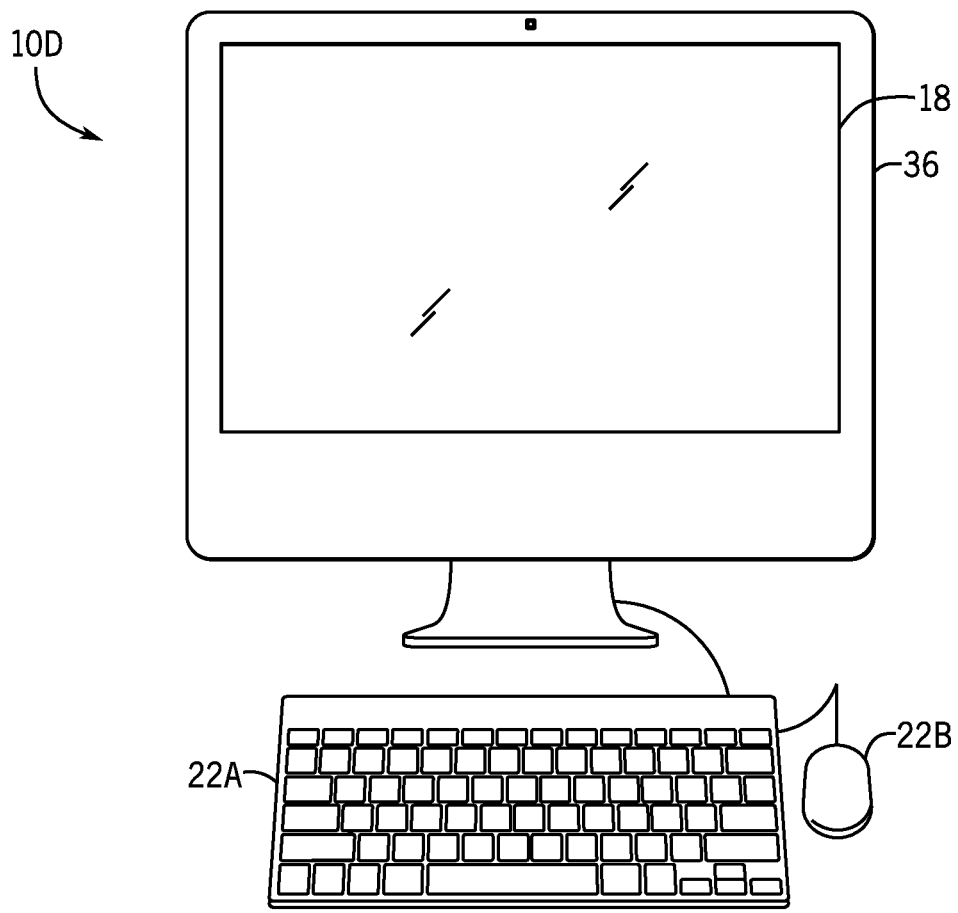
FIG. 5 is a front view of a desktop computer representing another embodiment of the electronic device of FIG. 1.
Figure 6:
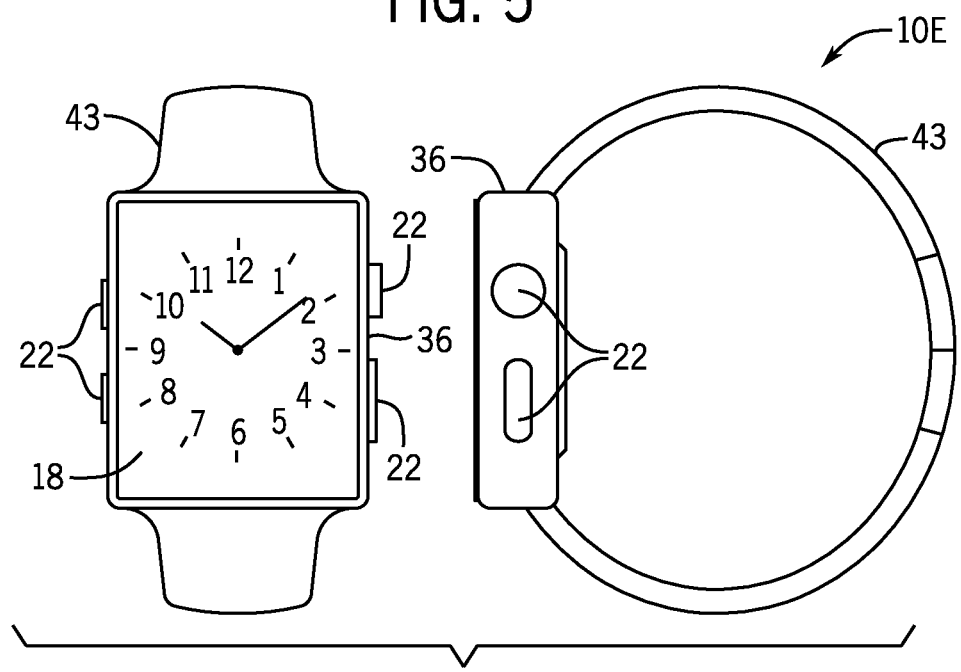
FIG. 6 is a front view and side view of a wearable electronic device representing another embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor 12 and other related items in FIG. 1 may be embodied wholly or in part as software, firmware, hardware, or any combination thereof. Furthermore, the processor 12 and other related items in FIG. 1 may be a single contained processing module or may be incorporated wholly or partially within any of the other elements within the electronic device 10.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may be a liquid crystal display (LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more organic light-emitting diode (OLED) displays, or some combination of LCD panels and OLED panels.

The input structures 22 of the electronic device 10 may enable a user to interact with the electronic device 10 (e.g., pressing a button to increase or decrease a volume level). The I/O interface 24 may enable the electronic device 10 to interface with various other electronic devices, as may the network interface 26. The network interface 26 may include, for example, one or more interfaces for a personal area network (PAN), such as a Bluetooth® or an ultra-wideband (UWB) network, for a local area network (LAN) or wireless local area network (WLAN), such as an 802.11x Wi-Fi network, for a wide area network (WAN), such as a 3rd generation (3G) cellular network, universal mobile telecommunication system (UMTS), 4th generation (4G) cellular network, long term evolution (LTE) cellular network, long term evolution license assisted access (LTE-LAA) cellular network, 5th generation (5G) cellular network, and/or 5G New Radio (5G NR) cellular network, and/or for a satellite network. In particular, the network interface 26 may include, for example, one or more interfaces for using a Release-15 cellular communication standard of the 5G specifications that include the millimeter wave (mmWave) frequency range (e.g., 24.25-300 GHz). A transceiver of the electronic device 10, which includes a transmitter and a receiver, may allow communication over the aforementioned networks (e.g., 5G, Wi-Fi, LTE-LAA, and so forth).

The network interface 26 may also include one or more interfaces, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB-H), ultra-Wideband (UWB), alternating current (AC) power lines, and so forth. As further illustrated, the electronic device 10 may include a power source 28. The power source 28 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as desktop computers, workstations, and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 10A, is illustrated in FIG. 2 in accordance with one embodiment of the present disclosure. The depicted computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a graphical user interface (GUI) or applications running on computer 10A. For example, a keyboard and/or touchpad may allow a user to navigate a user interface or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, California. The handheld device 10B may include an enclosure 36 to protect interior components from physical damage and to shield them from electromagnetic interference. The enclosure 36 may surround the display 18. The I/O interfaces 24 may open through the enclosure 36 and may include, for example, an I/O port for a hardwired connection for charging and/or content manipulation using a standard connector and protocol, such as the Lightning connector provided by Apple Inc., a universal serial bus (USB), or other similar connector and protocol.

User input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control, or may toggle between vibrate and ring modes. The input structures 22 may also include a microphone that may obtain a user's voice for various voice-related features, and a speaker that may enable audio playback and/or certain phone capabilities. The input structures 22 may also include a headphone input that may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, California.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or other similar device by Apple Inc. It should be noted that the computer 10D may also represent a personal computer (PC) by another manufacturer. A similar enclosure 36 may be provided to protect and enclose internal components of the computer 10D such as the display 18. In certain embodiments, a user of the computer 10D may interact with the computer 10D using various peripheral input structures 22, such as the keyboard 22A or mouse 22B, which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 43, may be an Apple Watch® by Apple Inc. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, OLED display, active-matrix organic light emitting diode (AMOLED) display, and so forth), as well as input structures 22, which may allow users to interact with a user interface of the wearable electronic device 10E.

Figure 7:
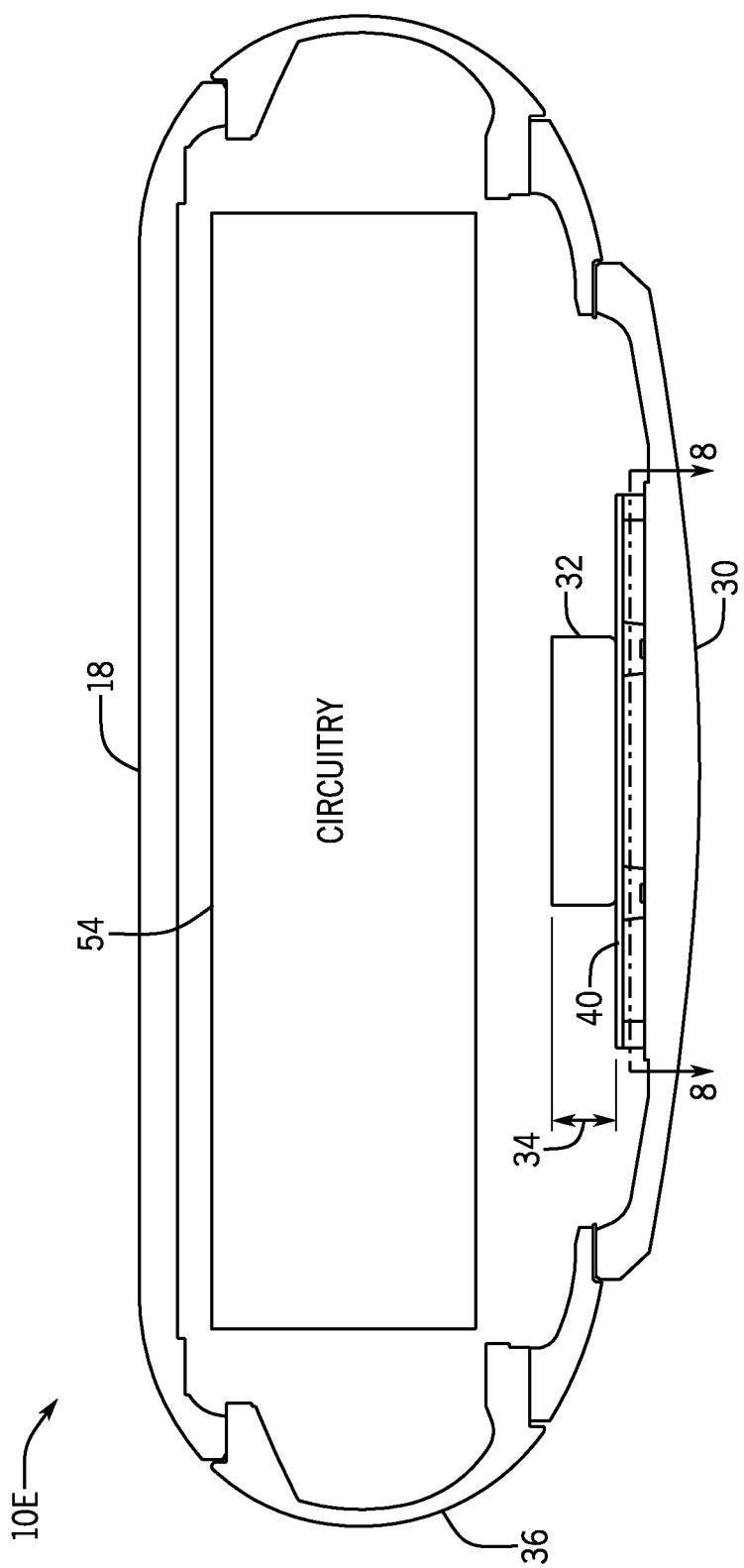
FIG. 7 is a cross-sectional side view of the wearable electronic device of FIG. 6 having a barrier assembly, according to an embodiment of the present disclosure.

With the foregoing in mind, FIG. 7 is a cross-sectional view of the wearable electronic device 10E, according to embodiments of the present disclosure. The wearable electronic device 10E may include a surface 30 coupled to the enclosure 36. The surface 30 may be formed of a glass material, a crystal material, or a combination thereof. In certain embodiments, the surface 30 may have high optical transmission (e.g., at least 60%, at least 70%, at least 80%, and so forth) in a particular wavelength range (e.g., ultraviolet to infrared, visible light range, 100 nanometers to 1 millimeter, and so forth). The wearable electronic device 10E may include a magnet 32 disposed in an interior cavity of the enclosure 36. In some embodiments, the magnet 32 may couple the wearable electronic device 10E to a charging station. For example, a corresponding magnet of the charging station may emit a magnetic field (e.g., having an opposite polarity to that of the magnet 32) that interacts with the magnet 32 to retain the wearable electronic device 10E on the charging station. In certain embodiments, the magnet 32 may be a rare-earth magnet, such as a neodymium magnet, a samarium-cobalt magnet, or a combination thereof. For example, the magnet 32 may be formed of an alloy of neodymium, iron, and boron. A thickness 34 of the magnet 32 may be selected to ensure the wearable electronic device 10E stays in place during a charging session. However, the thickness 34 of the magnet 32 may increase an overall size and associated manufacturing costs of the wearable electronic device 10E. As such, reducing the size (e.g., the thickness 34) of the magnet 32 while maintaining or increasing strength of the magnetic field may decrease manufacturing costs of the wearable electronic device 10E while ensuring that the wearable electronic device 10E stays in place during a charging session. In some instances, the magnet 32 may be removed entirely from the interior of the enclosure 36 while maintaining the strength of the magnetic field by incorporating one or more magnets into the barrier assembly 40.

The wearable electronic device 10E may include the barrier assembly 40. In some embodiments, the barrier assembly 40 may be disposed in the interior of the enclosure 36 and/or may be disposed at least partially between the surface 30 and circuitry 54. For example, the barrier assembly 40 may be disposed adjacent the surface 30. In certain embodiments, the barrier assembly 40 may be coupled to the surface 30, such as by an adhesive layer or material. Additionally or alternatively, the barrier assembly 40 may be in contact with the surface 30 when disposed adjacent the surface 30. For example, the barrier assembly 40 may be positioned against the surface 30 without any intervening layers and/or intermediate structures between the barrier assembly 40 and the surface 30. Alternatively, the barrier assembly 40 may be separated from the surface 30 by one or more intermediate structures and/or intervening layers. In certain embodiments, the barrier assembly 40 may be disposed adjacent the surface 30 and separated by an air gap located between the barrier assembly 40 and the surface 30. In some embodiments, the barrier assembly 40 may be disposed between the surface 30 and the magnet 32 and include any number of magnets, such as any number of rare-earth magnets. For example, the barrier assembly 40 may include any number of magnets embedded therein. Accordingly, the barrier assembly 40 and associated magnets may generate a magnetic field that supplements and/or replaces the magnetic field of the magnet 32 to couple the wearable electronic device 10E to a charging station. The wearable electronic device 10E may include the circuitry 54 disposed in the interior of the enclosure 36 and the circuitry 54 may include any number of components, such as the processor 12, the memory 14, the storage 16, and/or the network interface 26 of FIG. 1.

Figure 8:
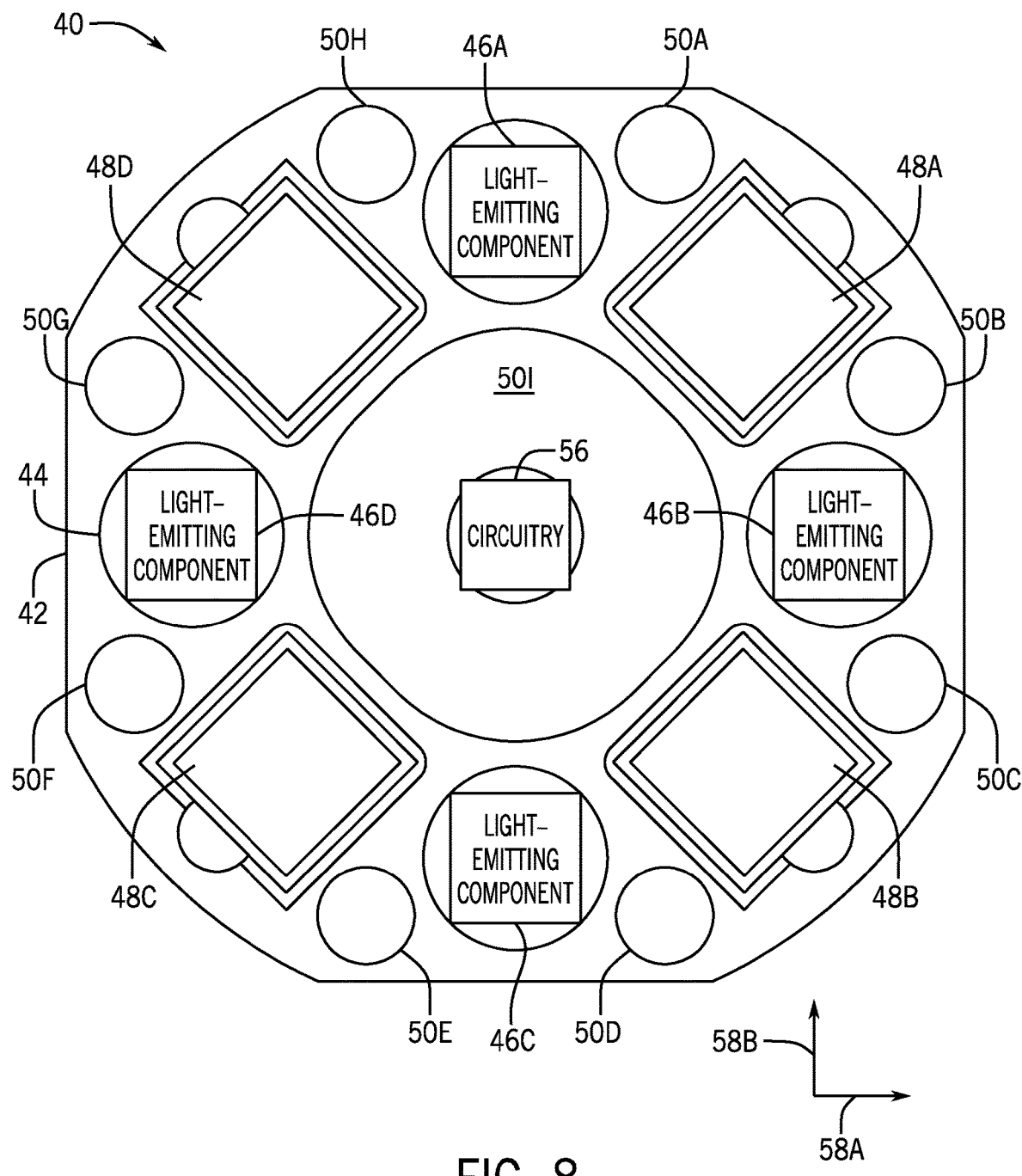
FIG. 8 is a cross-sectional top view of the barrier assembly of FIG. 7, according to an embodiment of the present disclosure.

With the foregoing in mind, FIG. 8 is a cross-sectional top view of the barrier assembly 40, according to an embodiment of the present disclosure. As illustrated, the barrier assembly 40 may include a housing 42, any number of apertures, such as aperture 44, any number of light-emitting components (e.g., light-emitting components 46A, 46B, 46C, 46D), any number of light sensors (e.g., light sensors 48A, 48B, 48C, 48D), any number of magnets (e.g., magnets 50A, 50B, 50C, 50D, 50E, 50F, 50G, 50H, 50I), and circuitry 56. In certain embodiments, the housing 42 may be formed of a prepolymer material, a polymer material, or a combination thereof and may have a thickness of up to 300 microns (e.g., up to 400 microns, up to 500 microns, up to 600 microns, and so forth). For example, the housing 42 may be formed of an epoxy material (e.g., an epoxy resin) and the epoxy material may include carbon. In certain embodiments, an epoxy resin may be cured to form the housing 42. For example, a curing material (e.g., a thiol material, an amine material, an anhydride material, an imidazole material, a photosensitive material, additional epoxy material, a phenol material, a catalyst material, or any combination thereof) may be added to the epoxy resin to form the housing 42, heat may be applied to the epoxy material and/or the curing material, light may be applied to the epoxy material and/or the curing material, pressure may be applied to the epoxy material and/or the curing material, or any combination thereof. In some embodiments, the material of the housing 42 may be selected according to desired optical characteristics (e.g., an optical density of the material). The optical density of a material may be a logarithm of a ratio of incident radiant power to transmitted radiant power through a material. For example, the housing 42 may be formed of a material having an optical density of at least 2 (e.g., at least 3, at least 4, at least 5, and so forth) at a thickness of at least 0.5 millimeters (e.g., at least 0.75 mm, at least 1 mm, at least 1.25 mm, and so forth).

Any number of apertures, such as aperture 44, may be formed at least partially through the housing 42. As illustrated, eight apertures 44 are formed at least partially through the housing 42. In some embodiments, each light-emitting component, such as the light-emitting components 46A, 46B, 46C, 46D, may be at least partially disposed in a corresponding aperture. The light-emitting components 46A, 46B, 46C, 46D, (collectively referred to as light-emitting components 46) may include one or more light-emitting diodes (LEDs) that may emit light in a visible frequency range (e.g., red light, green light, and so forth). In some embodiments, the light-emitting components 46 may emit flashes of light any number of times per second (e.g., up to 20 times per second, up to 50 times per second, up to 100 times per second, and so forth). The light-emitting components 46 may emit light through the surface 30 of the wearable electronic device 10E and the emitted light may be absorbed by a material adjacent the surface 30. For example, the wearable electronic device 10E may be worn on a wrist of a user and the emitted light may be absorbed into and/or reflected by the user.

The light sensors 48A, 48B, 48C, 48D (collectively referred to as light sensors 48) may detect light, such as light reflected back through the surface 30 of the wearable electronic device 10E. In certain embodiments, the light sensors 48 may be at least partially disposed in corresponding apertures of the housing 42. As such, walls of the apertures may reduce and/or prevent light emitted from the light-emitting components 46 from travelling directly to the light sensors 48 (e.g., without passing through the surface 30, without being absorbed by a material adjacent the surface 30, without being reflected by the material adjacent the surface 30, or any combination thereof). For example, the walls of the apertures may reduce and/or prevent light emitted by any of the light-emitting components 46 from traveling in a lateral direction (e.g., along lateral axis 58A), in a longitudinal direction (e.g., along longitudinal axis 58B), or a combination thereof and directly to any of the light sensors 48. Accordingly, light may not travel directly between any of the light-emitting components 46 and the light sensors 48 in a plane formed by the lateral axis 58A and the longitudinal axis 58B. As such, the housing 42 may reduce and/or prevent unintended light propagation between the light-emitting components 46 and the light sensors 48. In certain embodiments, the light sensors 48 may include one or more photodiodes, one or more photoresistors, one or more phototransistors, or any combination thereof. Additionally or alternatively, the light sensors 48 may detect light in a desired range (e.g., visible light, infrared light, ultraviolet light, ultraviolet light to infrared light, and so forth).

The magnets 50A, 50B, 50C, 50D, 50E, 50F, 50G, 50H, 50I (collectively referred to as magnets 50) may include rare-earth magnets (e.g., one or more neodymium magnets, one or more samarium-cobalt magnets, or a combination thereof) and may emit a magnetic field to couple the wearable electronic device 10E to a charging station. For example, the magnets 50 may be formed of an alloy of neodymium, iron, and boron. Each of the magnets 50 may be at least partially disposed in a corresponding aperture of the housing 42. For example, each of the magnets 50 may be embedded within a portion of the housing 42. Accordingly, a single surface of each magnet may be exposed (e.g., uncovered by the material of the housing 42) and any remaining surfaces of the magnet may be covered by the material of the housing 42. In certain embodiments, the magnets 50A, 50B, 50C, 50D, 50 E, 50F, 50G, 50H (collectively referred to as perimeter magnets) may be cylindrical in shape and/or have rounded edges, and may be disposed about a perimeter of the housing 42. For example, the perimeter magnets may be spaced (e.g., symmetrically spaced, substantially symmetrically spaced, asymmetrically spaced) in a configuration about the perimeter of the housing 42.

In certain embodiments, one or more of the perimeter magnets may be disposed in a first surface of the housing 42 and may be disposed adjacent a second surface of the housing 42 (e.g., adjacent the perimeter of the housing 42, adjacent an edge of the housing 42, and so forth). For example, the first surface of the housing 42 may be a front or top surface of the housing 42 and the second surface may be a side or outer surface of the housing 42. The second surface of the housing 42 may be substantially perpendicular to the first surface of the housing 42. The outer surface of the perimeter magnet may be flush with the second surface of the housing 42 at the perimeter of the housing 42. Additionally or alternatively, a layer of housing material may be disposed between the outer surface of the perimeter magnet and the second surface of the housing 42. For example, a threshold amount of housing material and/or a threshold distance (e.g., 1 nanometer (nm) or less, 10 nm or less, 1 micrometer (um) or less, 10 nm or less), 1 millimeter (mm) or less, 10 mm or less, and so on) may separate the outer surface of the perimeter magnet and the second surface of the housing 42. A central magnet 50I may be disposed about a center of the housing 42. In certain embodiments, the central magnet 50I may be larger (e.g., have a greater volume, have a greater surface area, have one or more greater dimensions) than each of the perimeter magnets 50A, 50B, 50C, 50D, 50E, 50F, 50G, 50H. Additionally or alternatively, the central magnet 50I may have an opening formed at least partially therethrough. For example, the opening may include a bore formed through a center of the central magnet 50I. The opening may be circular in shape and the circuitry 56 may be assembled and/or at least partially disposed in the opening of the central magnet 50I. In certain embodiments, the circuitry 56 may include any number of semiconductors and/or the circuitry 56 may be embedded within the housing 42. In some embodiments, the central magnet 50I may be rectangular in shape and may have rounded edges. The barrier assembly 40 may include one or more of the perimeter magnets 50A, 50B, 50C, 50D, 50E, 50F, 50G, 50H, the central magnet 50I, or a combination thereof.

Figure 9:
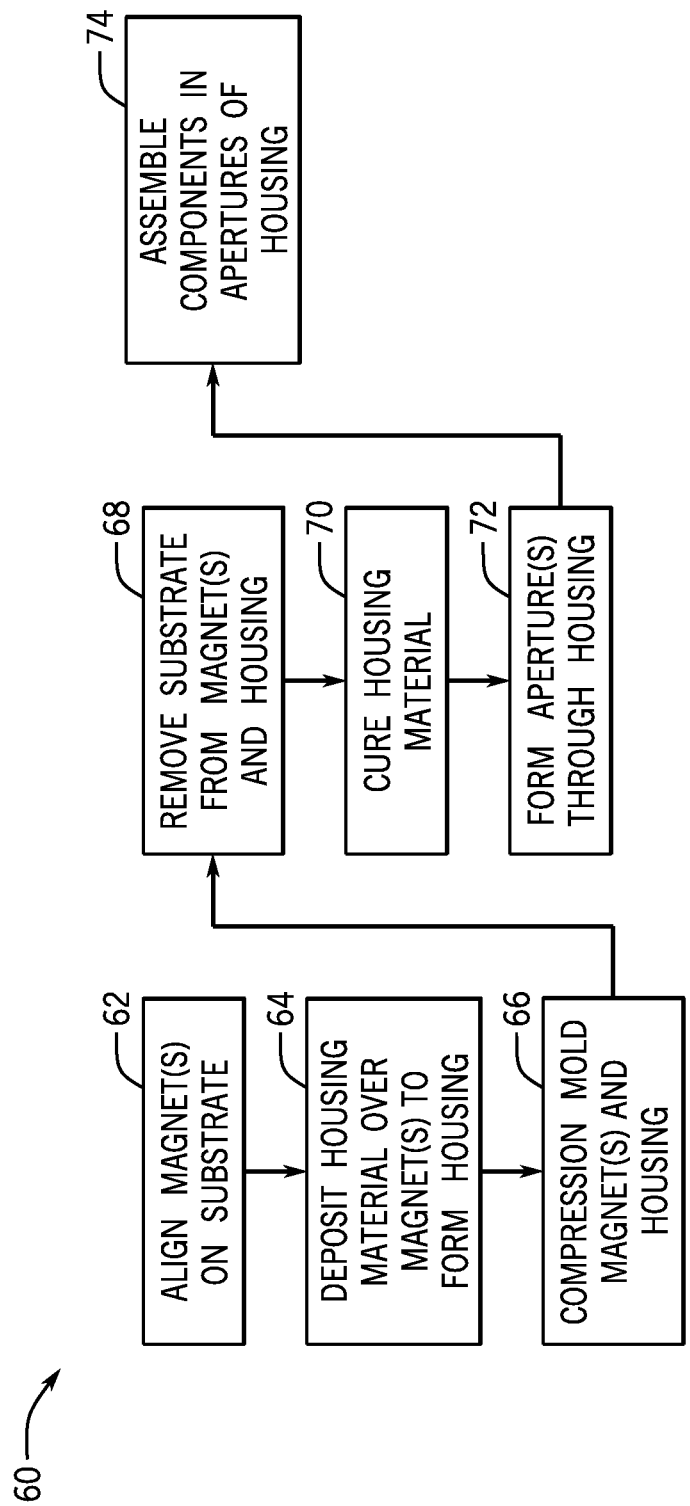
FIG. 9 is a flowchart of a method for forming the barrier assembly of FIG. 8, according to an embodiment of the present disclosure.

With the foregoing in mind, FIG. 9 is a flowchart of a method 60 for forming the barrier assembly 40 of FIG. 8, according to an embodiment of the present disclosure. Any suitable device (e.g., a controller) may control components (e.g., laser cutter, sprayer, and so forth) that may perform the method 60. In some embodiments, the method 60 may be implemented by executing instructions stored in a tangible, non-transitory, computer-readable medium. For example, the method 60 may be performed at least in part by one or more software components, such as an operating system, one or more software applications, and the like. While the method 60 is described using steps in a specific sequence, it should be understood that the present disclosure contemplates that the described steps may be performed in different sequences than the sequence illustrated, and certain described steps may be skipped or not performed altogether.

Figure 10:
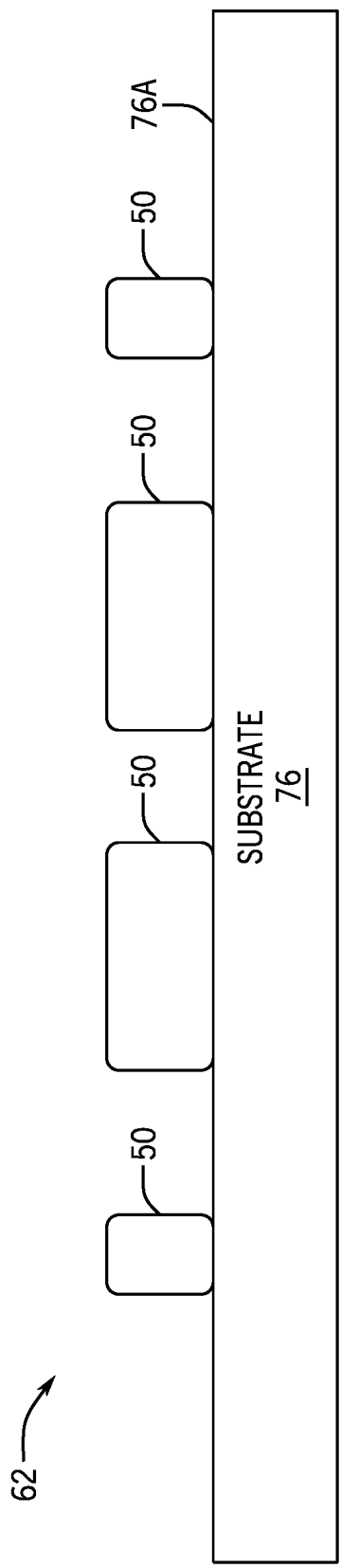
FIG. 10 is a perspective diagram of a step of the method for forming the barrier assembly of FIG. 8, according to an embodiment of the present disclosure.

At block 62, the magnets 50 may be aligned on the substrate 76. For example, the magnets 50 may be spaced apart on the substrate 76 and the substrate 76 may support the magnets 50 and retain the magnets 50 in place on the substrate 76. To illustrate, FIG. 10 is a perspective diagram of the block 62 of the method 60 for forming the barrier assembly 40, according to an embodiment of the present disclosure. The block 62 may include placing the magnets 50 on a substrate 76 (e.g., a mounting plate). The magnets 50 may be aligned and/or arranged on the substrate 76 according to a desired pattern (e.g., symmetrically spaced, substantially symmetrically spaced, asymmetrically spaced). In some embodiments, the substrate 76 may include a surface 76A to support the magnets 50 and the surface 76A may be a high friction surface, an adhesive surface or a combination thereof to retain the magnets 50 in place on the surface 76A of the substrate 76. For example, the surface 76A may include an adhesive strip or adhesive tape to retain the magnets 50. Additionally or alternatively, the surface 76A may include a coating (e.g., a thin film), such as a high friction coating, an adhesive coating, or a combination thereof. In some embodiments, the surface 76A may include any number of indicators corresponding to proper placement and/or alignment of the magnets 50 on the substrate 76. For example, the indicators may be painted on the surface 76A, may be one or more grooves formed in the surface 76A, may be one or more recesses formed in the surface 76A to receive the magnets 50, any other suitable indicator, or any combination thereof. In some embodiments, the substrate 76 may include an adhesive surface, a high friction surface, a surface having one or more recesses, or any combination thereof for retaining the magnets.

Figure 11:
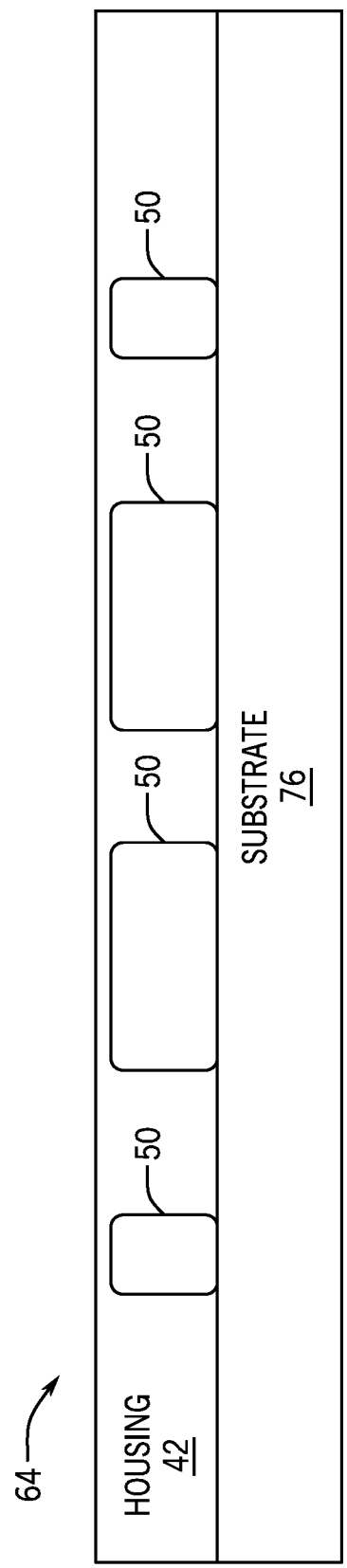
FIG. 11 is a perspective diagram of another step of the method for forming the barrier assembly of FIG. 8, according to an embodiment of the present disclosure.

Once the magnets 50 are placed correctly on the substrate 76, the housing 42 of the barrier assembly 40 may be formed. At block 64, housing material may be deposited over the magnets 50 and/or the substrate 76 to form the housing 42. For example, the housing material may be an epoxy material and the epoxy material may be deposited over the magnets 50 such that the magnets 50 become embedded in the housing 42. To illustrate, FIG. 11 is a perspective diagram of the block 64 of the method 60 for forming the barrier assembly 40, according to an embodiment of the present disclosure. The block 64 may include forming the housing 42 by depositing a material over the magnets 50 and/or the substrate 76. For example, the housing 42 may be formed by spraying the housing material over the magnets 50 and/or the substrate 76, electrocoating with the housing material, painting with the housing material, pouring the housing material over the magnets 50 and/or the substrate 76, spreading the housing material over the magnets 50 and/or the substrate 76, any other suitable deposition method, or any combination thereof. After depositing the housing material, the magnets 50 may be embedded within the housing 42 such that up to five surfaces of each magnet may be covered by the housing material. Additionally or alternatively, at least one surface of each magnet may be at least partially exposed (e.g., uncovered by the housing material) from the housing 42. Due to the placement of the magnets 50 on the substrate 76, the housing 42 may be substantially flush with an exposed surface of one or more of the magnets 50. At block 66, the magnets 50 and the housing 42 may be compression molded. For example, the magnets 50 may be compressed between the substrate 76 and the housing 42 to embed the magnets 50 in the housing 42. In some embodiments, heat may be applied to the housing 42, the magnets 50, and/or the substrate 76 during the compression molding process. Additionally or alternatively, the epoxy material of the housing 42 may be at least partially cured during the compression molding process.

At block 68, the substrate 76 may be removed from the magnets 50 and/or the housing 42. For example, the substrate 76 may be separated from the magnets 50 and/or the housing 42 by exerting a force on the substrate 76, by removing (e.g., machining, cutting, etching, scraping, and so forth) the material of the substrate 76, or any other suitable process. At block 70, the housing 42 may be cured. For example, compressive forces, heat, light, or any combination thereof may be applied to the housing 42 and/or the magnets 50 to cure the epoxy material of the housing 42.

Figure 12:
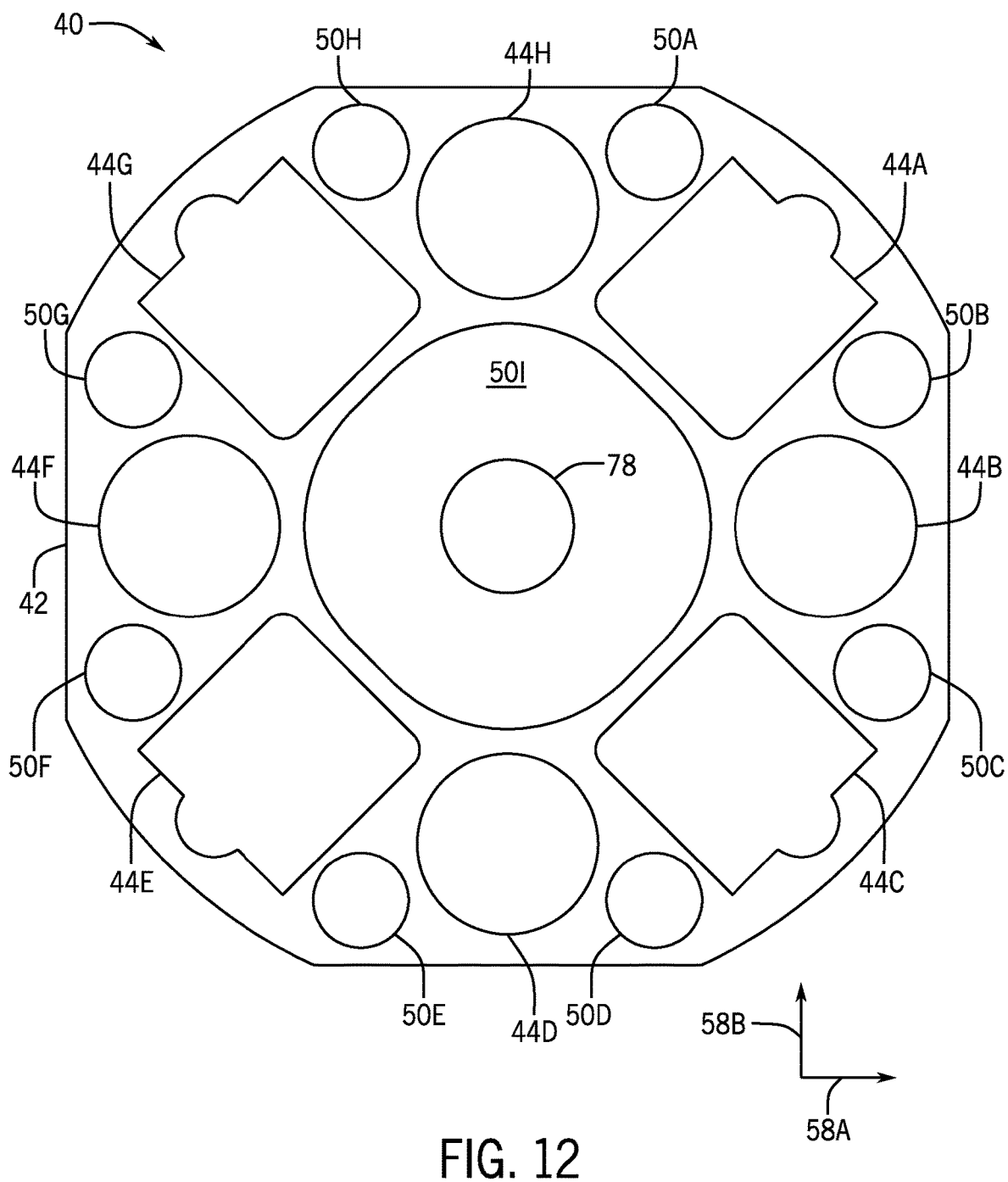
FIG. 12 is a cross-sectional top view of the barrier assembly of FIG. 8 having a number of apertures, according to an embodiment of the present disclosure.

After forming the housing 42 over the magnets 50, apertures may be formed in the housing 42 to house one or more components of the wearable electronic device 10E. At block 72, any number of apertures may be formed in the housing 42. For example, the apertures may be formed by laser dicing, laser cutting, laser ablation, machining, cutting, drilling, any other suitable method, or any combination thereof. With the foregoing in mind, FIG. 12 is a cross-sectional top view of the barrier assembly 40 including a number of apertures 44A, 44B, 44C, 44D, 44E, 44F, 44G, 44H, according to an embodiment of the present disclosure.

After depositing the housing 42 over the magnets 50, the substrate 76 may be separated from the housing 42 and the magnets 50 and the apertures 44A, 44B, 44C, 44D, 44E, 44F, 44G, 44H (collectively referred to as apertures 44) may be formed through the housing 42. The apertures 44 may be formed by any suitable method, such as laser dicing, laser cutting, laser ablation, drilling, waterjet cutting, plasma cutting, or any combination thereof. In certain embodiments, the apertures 44 may be configured to house one or more light-emitting components (e.g., LEDs) and/or one or more light sensors. The apertures 44 may be disposed about (e.g., symmetrically spaced, substantially symmetrically spaced, asymmetrically spaced) the perimeter of the housing 42. In some embodiments, the apertures 44 may be formed in a first surface of the housing 42 and may be disposed adjacent a second surface of the housing 42 (e.g., adjacent the perimeter of the housing 42, adjacent an edge of the housing 42, and so forth). For example, the first surface of the housing 42 may be a front or top surface and the second surface may be a side or outer surface. The second surface may be substantially perpendicular to the second surface. Additionally or alternatively, walls of the apertures 44 may separate the apertures 44 from the second surface of the housing 42. For example, a threshold amount of housing material and/or a threshold distance (e.g., 1 nanometer (nm) or less, 10 nm or less, 1 micrometer (um) or less, 10 nm or less), 1 millimeter (mm) or less, 10 mm or less, and so on) may separate the apertures 44 from the second surface of the housing 42. In certain embodiments, the apertures 44B, 44D, 44F, 44H (collectively referred to as light-emitting component apertures) may be cylindrical in shape and may be spaced (e.g., symmetrically spaced, substantially symmetrically spaced, asymmetrically spaced), about the perimeter of the housing 42. The apertures 44A, 44C, 44E, 44G (collectively referred to as light sensor apertures) may be formed in the housing at a threshold distance from any of the light-emitting component apertures. As such, walls of the apertures may reduce and/or prevent light emitted from the light-emitting components 46 from travelling directly to the light sensors 48 (e.g., without passing through the surface 30, without being absorbed by a material adjacent the surface 30, without being reflected by the material adjacent the surface 30, or any combination thereof). For example, the walls of the apertures may reduce and/or prevent light emitted by any of the light-emitting components 46 from traveling in a lateral direction (e.g., along lateral axis 58A), in a longitudinal direction (e.g., along longitudinal axis 58B), or a combination thereof and directly to any of the light sensors 48. Accordingly, the housing 42 may reduce and/or prevent unintended light propagation between the light-emitting components 46 and the light sensors 48. For example, a threshold amount of material of the housing 42 may be disposed between any of the light sensor apertures and any of the light-emitting component apertures such that the housing 42 may reduce and/or prevent emitted light from one or more of the light-emitting components 46 from directly entering one or more of the light sensors 48. Accordingly, light may not travel directly between any of the light-emitting components 46 and the light sensors 48 in a plane formed by the lateral axis 58A and the longitudinal axis 58B. The light sensor apertures may be substantially rectangular in shape. An opening 78 may be formed through the central magnet 50I. For example, the opening 78 may include a bore formed through a center of the central magnet 50I. The opening 78 may also be formed through a center of the housing 42. In certain embodiments, circuitry of the wearable electronic device 10E may be assembled and at least partially disposed in the opening 78.

At block 74, one or more components of the wearable electronic device 10E may be assembled in corresponding apertures of the housing 42. As shown in FIG. 8, a light-emitting component 46, a light sensor 48, one or more LEDs, circuitry, or any other suitable component may be assembled in the formed apertures of the housing 42. In this manner, the method 60 may enable forming the barrier assembly 40 of FIG. 8.

By employing the techniques described in the present disclosure, the systems and methods described herein may allow for the reduction in size and costs of a wearable electronic device. Further, embedding magnets in the barrier assembly housing may ensure the wearable electronic device stays in place on a charging station during a charging session.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A barrier assembly, comprising:
   a housing comprising an aperture;
   a plurality of magnets at least partially disposed within the housing and distributed about a perimeter of the housing;
   a central rare-earth magnet at least partially disposed within the housing inwards from the perimeter of the housing and the plurality of magnets distributed about the perimeter of the housing; and
   a light-emitting component disposed within the aperture.

2. The barrier assembly of claim 1, wherein the housing is formed of a material having an optical density of at least 3 at a thickness of 1 mm.

3. The barrier assembly of claim 1, wherein the central rare-earth magnet is embedded within the housing.

4. The barrier assembly of claim 1, wherein the housing is formed of an epoxy material.

5. The barrier assembly of claim 1, wherein the central rare-earth magnet comprises a samarium-cobalt magnet.

6. The barrier assembly of claim 1, wherein the central rare-earth magnet comprises a neodymium magnet.

7. The barrier assembly of claim 1, wherein the central rare-earth magnet has an opening formed therethrough, and the barrier assembly comprises circuitry at least partially disposed in the opening.

8. The barrier assembly of claim 1, wherein the aperture is formed adjacent the perimeter of the housing.

9. A barrier assembly, comprising:
a housing comprising a plurality of apertures formed about a perimeter of the housing;
a magnet at least partially embedded within the housing, the magnet comprising an opening formed through a center of the magnet;
circuitry at least partially disposed in the opening formed through the center of the magnet; and
a plurality of light-emitting components, each light-emitting component at least partially disposed within a corresponding aperture of the plurality of apertures.

10. The barrier assembly of claim 9, comprising a plurality of magnets embedded within the housing.

11. The barrier assembly of claim 10, wherein the plurality of magnets is disposed about the perimeter of the housing.

12. The barrier assembly of claim 10, comprising a symmetrical arrangement of the plurality of magnets.

13. The barrier assembly of claim 9, wherein the housing comprises a second plurality of apertures formed about the perimeter of the housing.

14. The barrier assembly of claim 13, comprising a plurality of light sensors, each light sensor at least partially disposed within a corresponding aperture of the second plurality of apertures.

15. An electronic device, comprising:
an enclosure;
a surface coupled to the enclosure;
a barrier assembly disposed adjacent to the surface, the barrier assembly comprising:
a housing comprising a plurality of apertures formed about a perimeter of the housing;
a plurality of magnets embedded within the housing and disposed about the perimeter of the housing;
a plurality of light-emitting components, each light-emitting component at least partially disposed within a corresponding aperture of the plurality of apertures; and
a plurality of light sensors, each light sensor at least partially disposed within an additional corresponding aperture of the plurality of apertures, wherein each magnet of the plurality of magnets is positioned at least partially between a corresponding light sensor of the plurality of light sensors and a corresponding light-emitting component of the plurality of light-emitting components.

16. The electronic device of claim 15, wherein a surface of each magnet of the plurality of magnets is exposed.

17. The electronic device of claim 15, comprising a symmetrical arrangement of the plurality of magnets.

18. A barrier assembly, comprising:
a housing comprising a plurality of apertures formed therethrough;
a plurality of light-emitting components, each light-emitting component at least partially disposed within a first corresponding aperture of the plurality of apertures;
a plurality of light sensors, each light sensor at least partially disposed within a second corresponding aperture of the plurality of apertures;
a plurality of magnets embedded within the housing and disposed about a perimeter of the housing, each magnet positioned at least partially between a corresponding light sensor and a corresponding light-emitting component, and wherein a surface of each magnet is exposed from the housing;
a central magnet disposed within the housing, the central magnet comprising an opening formed through a center of the central magnet; and
circuitry at least partially disposed in the opening.

19. The barrier assembly of claim 1, comprising:
an additional aperture of the housing; and
a light sensor disposed in the additional aperture, wherein a magnet of the plurality of magnets is positioned at least partially between the light sensor and the light-emitting component.

20. The barrier assembly of claim 9, comprising:
a plurality of light sensors, each light sensor at least partially disposed within an additional corresponding aperture of the plurality of apertures; and
a plurality of magnets at least partially disposed within the housing and distributed about a perimeter of the housing, wherein a magnet of the plurality of magnets is positioned at least partially between a light sensor of the plurality of light sensors and a light-emitting component of the plurality of light-emitting components.

* * * * *